(12) United States Patent
Liu

(10) Patent No.: US 6,636,124 B1
(45) Date of Patent: Oct. 21, 2003

(54) METHOD AND APPARATUS FOR ACCURATE PULSE WIDTH MODULATION

(75) Inventor: Gang Liu, Novi, MI (US)

(73) Assignee: Analog Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/000,775

(22) Filed: Nov. 30, 2001

Related U.S. Application Data
(60) Provisional application No. 60/250,565, filed on Nov. 30, 2001.

(51) Int. Cl.[7] .................................................. H03K 7/08
(52) U.S. Cl. ........................................ 332/109; 327/172
(58) Field of Search ......................... 332/109; 327/175, 327/130, 176, 179, 172, 323; 330/10

(56) References Cited

U.S. PATENT DOCUMENTS

| | | | |
|---|---|---|---|
| 2,379,484 A | 7/1945 | Haynes | 179/171 |
| 3,551,851 A | 12/1970 | Engel | 332/9 |
| 3,585,517 A | 6/1971 | Hebert | 330/10 |
| 4,016,501 A | 4/1977 | Jasinski et al. | 330/10 |
| 4,059,807 A | 11/1977 | Hamada | 330/10 |
| 4,134,076 A | 1/1979 | Suzuki et al. | 330/10 |
| 4,337,438 A | 6/1982 | Guggenbühl et al. | 330/10 |
| 4,371,840 A | 2/1983 | Yokoyama | 330/10 |
| 4,415,863 A | 11/1983 | Tokumo | 330/10 |
| 4,504,793 A | 3/1985 | Yokoyama | 330/10 |
| 4,531,096 A | 7/1985 | Yokoyama | 330/10 |
| 4,949,048 A | 8/1990 | Tokumo et al. | 330/10 |
| 4,952,884 A | 8/1990 | Tokumo et al. | 330/10 |
| 5,001,413 A | 3/1991 | Ohms | 323/285 |
| 5,262,733 A | 11/1993 | Nakajima et al. | 330/10 |
| 5,508,663 A | 4/1996 | Konno | 330/10 |
| 5,589,837 A | * 12/1996 | Soleimani et al. | 342/359 |
| 5,606,296 A | 2/1997 | Seong | 332/109 |
| 5,777,503 A | 7/1998 | Faulk | 327/323 |
| 5,805,020 A | 9/1998 | Danz et al. | 330/10 |
| 5,886,484 A | 3/1999 | Fucili et al. | 318/254 |
| 5,986,426 A | 11/1999 | Rowan | 318/599 |
| 6,300,825 B1 | * 10/2001 | Dijkmans et al. | 330/10 |
| 6,307,431 B1 | 10/2001 | Botti et al. | 330/10 |
| 6,313,602 B1 | 11/2001 | Arefeen et al. | 318/801 |

* cited by examiner

Primary Examiner—Robert Pascal
Assistant Examiner—Joseph Chang
(74) Attorney, Agent, or Firm—Cantor Colburn LLP

(57) ABSTRACT

A pulse width modulation (PWM) circuit has a PWM output signal that features accurate timing even in the face of interference imposed upon the control signal representative of the desired PWM duty cycle. The PWM circuit includes or has a first or switching section and a second or analog section. The second section has an operational amplifier with a summing circuit that sums two input signals, namely a triangular wave signal and the control input signal, and then amplifies the summed signal to produce a trapezoidal waveform output delivered to the second section. The first section features a two-input comparator that produces a PWM signal output with a fast transition in response to trapezoidal output fed as an input and compared to a stable reference signal. Due to the speed of the op amp, timing errors on the PWM output signal due to interference on the control signal are minimized.

12 Claims, 4 Drawing Sheets

METHOD AND APPARATUS FOR ACCURATE PULSE WIDTH MODULATION

CROSS-REFERENCE TO RELATED APPLICATIONS

This application claims priority to U.S. provisional patent application Serial No. 60/250,565 filed Nov. 30, 2001 by the same inventor and with the title "Method and Apparatus for Improved Pulse Width Modulation," the entire specification of which is incorporated herein by reference.

BACKGROUND OF THE INVENTION

1. Technical Field

The present invention relates in general to pulse width modulation circuits, and in particular to pulse width modulation circuits used in conjunction with circuits for controlling heavier and noise sensitive electrical loads, such as laser driver power circuits, on printed circuit boards and like substrates, in a highly accurate manner.

2. Discussion

Pulse width modulation (PWM) circuits have been in use for over forty years, and have grown in popularity and widespread use significantly in the last 30 years or so. In many applications, the accuracy of the timing of the individual pulse width modulation signals is not a particular concern, especially in some circuit applications like motor drive circuits, that will be discussed below. However, in a variety of precision circuit applications, where having a stable duty cycle of the individual pulses of a PWM pulse train is important, there have been continuing attempts to improve and refine duty cycle stability of such circuits and/or reduce their susceptibility to external or internal interferences. Nonetheless, there are at least noise or interference problems that appears to have been not solved by those PWM circuits that have been seen. Further this particular noise or interference problem is frequently present on PWM circuits implemented on printed circuit boards, particularly if there is ground-loop feedback among the control, comparator and/or power circuits. This particular problem will now be explained with reference to FIGS. 1 and 2.

FIG. 1 shows the conventional design of a pulse width modulation (PWM) circuit 20, which has a comparator 22 provided with two inputs, namely noninverting input 24 and inverting input 26, and an output 28. One of the inputs, such input 24, is connected to a triangle wave source Vtrwv(t), while another input 26 is connected to a control signal, Vcntr(t). As shown in FIG. 2A, the triangle waveform may take that the form of a conventional symmetrical rising and falling shape 34 with a generally uniform frequency, or it may take the form a conventional sawtooth waveform (not shown), also with a generally uniform frequency, depending on the design of the comparator circuit and/or the waveform generator voltage. The control signal, Vcntr(t), may vary with time, and in FIG. 2A, is represented by a straight line 36. A resulting PWM signal, Vout(t), is generated at output 28 of comparator 22. This PWM signal is represented by waveform 38 in FIG. 2B. The maximum peak-to-peak value of the triangle wave voltage on input 24 is within the input voltage range of comparator 22, and it is usually at 3 to 5 volts for a comparator powered by a 5 volt power supply.

As shown in FIG. 2A, when an interference voltage, Vint, is added to the control signal input, it will falsely trigger the comparator, and the trigger error in time caused by this interference is: Te=Vint/SR, where SR is the slew rate of the triangle wave voltage at another input of the comparator, its unit of measure being V/t, that is volts/time. FIG. 2 shows that when this interference signal Vint is added on top of the control input signal Vcntr(t), for example, it results in an earlier switching of comparator 22 from its high state to its low state, which means that this process of adding interference produces a trigger error Te, as shown in FIG. 2B. In other words, the output signal Vout(t) at output 28 is falsely triggered prematurely by the additive interference signal. Vint of a negative-going interference voltage impressed for any reason upon the control signal Vcntr would also result in false triggering in an opposite or time-delayed sense. In both cases, this error in time will be seen as a noise at the output voltage which will be proportional to the time error Te.

The interference signal or signals may arise from a variety of possible sources, and the severity of this noise may vary depending the specific circuits used, the noise source, the lay-out of circuit components, the routing of conductors and/or ground plane configurations, provisions that are made for shielding circuit components, leads and/or wires from electromagnetic induction, external noise, and the like. In a number of applications, for example, motor drive circuits, slight errors in the timing of individual pulses within a train of digital pulses likely will not have any significant effects. Moreover, in many automatic servo systems which use PWM drive signals, the closed loop nature of the control system automatically compensates for repeated or continuous noise that produces a steady state timing error in the length of individual square wave pulse in a PWM drive signal pulse train. However, in other systems, such as high-speed digital communications systems, including laser-based fiber optic systems which use electro-optical interfaces and PWM-based laser driver circuits, noise may lead to transposition errors in the state of the digital information and/or may result in the need to reduce the operational speed of the circuitry to take into account that interference signals will result in the time-shifting of individual pulses of the laser driver circuits in the manner described in connection with the waveforms shown in FIG. 2.

A number of earlier patents relating to PWM circuits have shown a variety of techniques to improve the accuracy of and/or the immunity of such circuits from noise or other forms of interference or variations in performance. Such patents include the following:

| | |
|---|---|
| 4,059,807 to Hamada | 4,134,076 to Suzuki et el. |
| 4,337,438 to Guggenbuhl et al. | 4,504,793 to Yokohama |
| 4,514,863 to Tokumo | 4,531,096 to Yokoyama |
| 4,949,048 to Tokumo et al. | 4,952,884 to Tokumo et al. |
| 5,001,413 to Ohms | 5,508,663 to Konno |
| 5,262,733 to Nakajima et al. | 6,300,835 to Kijkmans et al. |

The foregoing patents do help show that state of the art with respect to the use and understanding of PWM circuits is well-developed, and that a number of steps have been taken over the years to combat noise and/or interference and/or transient condition problems encountered with PWM circuits used in a variety of applications. Accordingly, all of these patent references are hereby incorporated by reference as helping show what is now generally known in the field of electronic PWM circuits and taught in various U.S. patents. However, none of these patents appears to address how to solve or substantially reduce the interference or noise problem of the type described above with regard to FIGS. 1 and 2.

Accordingly, there is a continuing need to develop highly accurate and low noise pulse width modulation circuits that are less susceptible to altered timing of the individual pulses within a train of repetitive pulses of a PWM drive system. There is also a need to provide for PWM circuits which produce more accurate and stable timing of individual pulses even in the presence of interference signals impressed upon the input control signal, no matter what the source of the noise or interference.

Accordingly, it is a primary object of the present invention to provide an circuit apparatus and method which helps substantially reduce the adverse timing effects of interference signals imposed upon either the triangular waveform input signal or the input control signal supplied to a PWM controller. A related object of the present invention is to achieve this object without the use of exotic new control circuits, or the use of extra-high precision components.

Still another object is to develop a method and circuits which substantially solve or reduce the adverse noise/timing problem created by interference imposed upon the input leads to the comparator circuits of PWM controllers, particularly PWM controllers implemented with one or more printed circuit board designs involving power switching devices. A related object of the present invention is to advance the state of the art with respect to PWM methods and circuits which are particularly useful in high-speed data transmission applications, including but not limited to PWM-based drivers for diode lasers and other lasers used in optical telecommunication and instrumentation applications, including but not limited to fiber-optic communications systems and networks.

SUMMARY OF THE INVENTION

In light of the foregoing problems and in order to fulfill one or more of the foregoing objects, there is provided, in accordance with a first aspect of the present invention, a highly accurate, stable and low noise pulse width modulation circuit that features accurate timing in the face of an interference signal being imposed upon a control signal input thereto that is representative of the duty cycle of the desired PWM output. The PWM circuit is comprised of a first section which may be a digital or switching section, and second or analog section. The first section has a comparator provided with at least first and second inputs and an output, one of the inputs being a noninverting input and the other input being an inverting input. The output produces a PWM signal when proper signals are applied to the first and second inputs of the comparator. The first input signal for this section comes from the output of the analog section, and the second input signal may simply be a steady reference signal, such as a percentage of the power supply voltage.

The second or analog section of the PWM circuit includes an operational amplifier provided with first and second inputs and an output, one of the inputs being a noninverting input and the other input being an inverting input. The output of this op amp produces a substantially on-and-off signal, preferably in the form of a trapezoidal signal. The output of the operational amplifier of this analog section is connected to one of the inputs of the comparator of the switching section.

The second section preferably has signal adding means for combining first and second input signals, and providing the summed signal to at least one of the inputs of the operational amplifier of the analog section. The first input signal is connectable to a triangular wave source that preferably is highly stable and serves as the source of basic frequency of the PWM output signal. The second input signal is connectable to a control input signal. The analog voltage or value of this signal is generally proportional to the desired duty cycle of the PWM signal to be produced by the output of the comparator.

In operation, the control signal is summed and amplified in combination with the first input from the triangular wave source by the operational amplifier, whereby the output signal produced by the operational amplifier is a trapezoidal waveform. That output signal is delivered to and is in communication with at least one input of the comparator of the switching section.

The gain of the operational amplifier determines the rise time of the trapezoidal output signal. This gain should be set to at least five, and is preferably in the range of about ten to one hundred, although, depending on just how fast the sweep frequency of the PWM signal is, the gain may be set to a few hundred or even one thousand or more. The net result is that the fast rise time or slew rate of the op amp causes the timing of the PWM output signal to much more accurately follow the timing of the input control signal, as best illustrated and explained in connection with the circuit of the present shown in FIG. 3, and the waveforms of FIGS. 4A and 4B.

According to a second aspect of the invention, there is provided a method of producing a pulse width modulation (PWM) output signal train having fast transitions in a manner that less susceptible to PWM timing errors on account an interference signal imposed upon a control signal input thereto. As with the PWM circuit of the present invention briefly described above, this control signal has an analog value that is representative of the duty cycle of the desired PWM output. The method of the present invention comprises the steps of: (1) providing a first input signal connected to a triangular wave source; (2) providing a second input signal connected to the control signal representative of the duty cycle of the desired PWM output; (3) adding the first and second input signals in real time to produce a summed signal; (4) continuously providing the summed signal to an operational amplifier having a gain of at least five, in order to produce a substantially on-and-off output signal from the amplifier; (5) providing the substantially on-and-off output signal to a comparator; and (6) arranging the comparator to produce a PWM output signal that turns on and off in response to receiving the switching states of the substantially on-and-off signal.

As with the operation of the PWM circuit of the present invention, the method of the present invention further includes the steps of: providing a comparator that has first and second inputs, providing the substantially on-and-off output signal to the first input of the comparator, arranging the operational amplifier to produce a trapezoidal waveform as the form of the substantially on-and-off output signal, and providing the trapezoidal waveform to the first input of the comparator; and providing a reference signal to the second input of the comparator. Again, the operational amplifier is provided with a gain of at least five and preferably has a closed loop gain of at least ten, and more preferably has a closed loop gain of about 50 to about 100 or more.

The PWM circuit and PWM method of the present invention are each very well suited for driving a laser driver circuit. In such an arrangement, the input of the laser driver circuit is connected to the PWM output train of the comparator of the first or switching section of the PWM circuit of the present invention In that manner, the laser is turned on and off in step with and in response to the PWM output train, which in turn is accurately controlled by the level of the input control signal.

The foregoing objects and advantages of the present invention, together with the structure and characteristics thereof, which were summarized in the foregoing passages, will become more apparent to those skilled in the art upon reading the detailed description of the preferred embodiments which follow in this specification, taken together with the illustrations thereof presented in the accompanying figures.

BRIEF DESCRIPTION OF THE DRAWINGS

The drawings form an integral part of the description of the preferred embodiments and are to be read in conjunction therewith. Like reference numerals designate the same or similar components or features in the various Figures, where.

DETAILED DESCRIPTION OF THE PREFERRED EMBODIMENTS

The following description of the preferred embodiments and methods are intended to be fully instructive about the various aspects of the present invention. Nonetheless, the circuits and methods described and shown herein are merely exemplary in nature and are not intended to limit the claimed invention or the applications or uses to which this invention in its various embodiments and implementations may be put.

The design of a PWM controller of the present invention can reduce aforementioned timing error dramatically under the same interference conditions, so much so that a 10 times to 50 times, or even 100 times or more reduction can readily be achieved. Further, it is expected that timing error reductions on the order of 200 times to up to 500 or more times, such as a 1000 times, reduction in the severity of the timing errors can be achieved with the use of precision comparator and/or amplifier equipment. In addition, there are multiple ways of implementing the circuits of the present invention which achieve these results. An exemplary set of such circuits is shown in schematic form in the various figures discussed below. First, however, a basic circuit and the fundamental principles of the present invention will be discussed with respect to FIGS. 3 and 4. Then, alternative circuit implementations will be shown and described.

Figure 3:
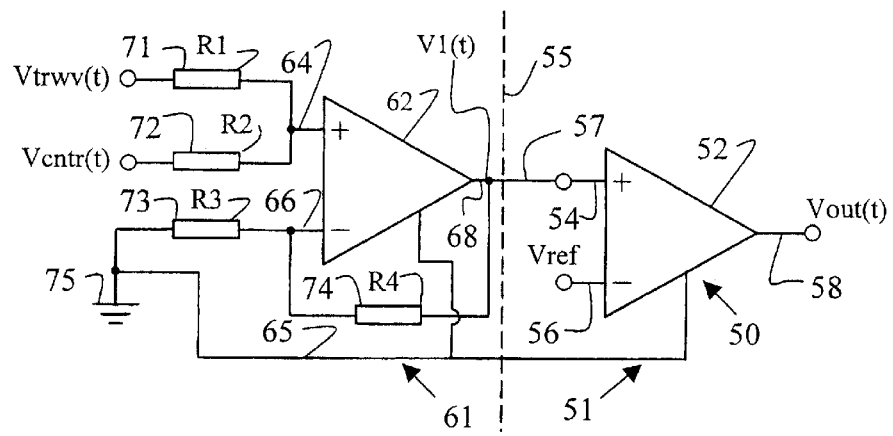
FIG. 3 shows a schematic diagram of a first embodiment of a pulse width modulation controller of the present invention.
Figure 4:
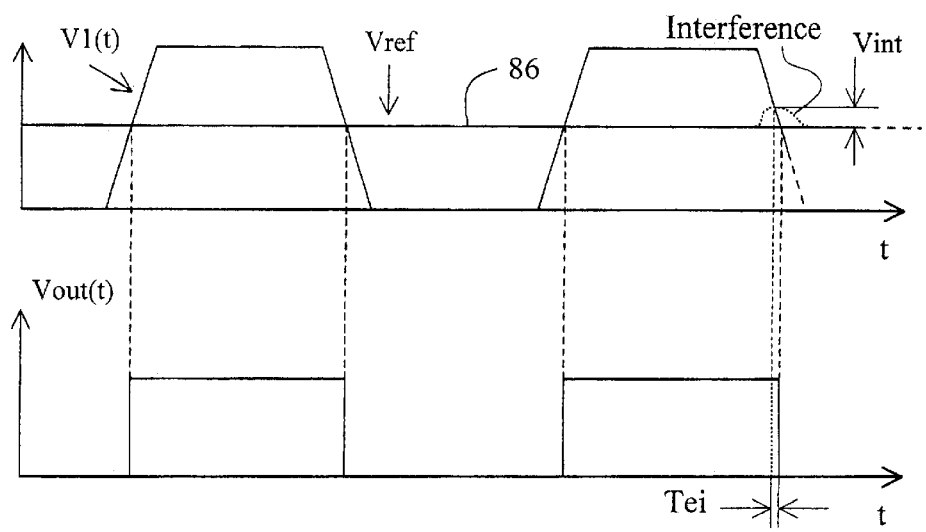
FIG. 4 is a set of time versus voltage graphs showing in FIG. 4A thereof a trapezoidal waveform generated from an amplified comparator output, and a generally flat control signal which are fed to the two inputs of the FIG. 3 amplifier, and showing in FIG. 4B thereof the resulting PWM wave form output, and showing the interference signal and resulting improvement or smaller size of the timing or triggering error produced in the output on account of the interference signal superimposed on the input signal.

FIG. 3 is a schematic of the basic PWM controller of the present invention. FIG. 3 shows a pulse width modulation (PWM) circuit 50 of the present invention, which has two sections, a digital section 51 to right of vertical dashed line 55 interconnected by a signal-carrying conductor 57 to an analog section 61 to the left of line 55. A ground path, illustrated by conductor 65, also interconnects the digital and analog sections 51 and 61. Digital section 51 is schematically shown to consist of comparator 52 provided with two inputs, namely noninverting input 54 and inverting input 56, and an output 58. Noninverting input 56 is connected to a reference voltage Vref which may be an intermediate voltage signal selected to be triggered at about the same point at Vcntr(t) shown in FIG. 1. If desired, Vref may be set equal to Vcntr(t) if desired. Analog section 61 is schematically shown to consist of operational amplifier 62 having two inputs, namely noninverting input 64 and inverting input 66 and an output 68, which is connected via conductor 57 to one of the inputs, such input 54, of comparator 52. One of the inputs of op amp 62 is connected through two resistors 71 and 72, whose resistance values are respectively called out as R1 and R2. A triangular wave source Vtrwv(t) is connected to the other side of resistor 71 and a control signal source Vcntr(t) is connected to the other side of resistor 72. A third resistor 73, whose resistance value is called out as R3, is connected to the other one of the inputs of op amp 62, namely input 66. The other side of resistor 73 is connected to a ground that is also tied to conductor 75 representing the ground path. A fourth resistor 74 connected as shown functions as a linear feedback path between output 68 and inverting input 66 of op amp 62.

In the FIG. 3 circuit, the control signal Vcntr(t) and the triangle wave voltage Vtrwv(t) are added together through input resistors 71 and 72. The adding ratio can be set by the values of resistors 71 and 72, previously identified as values R1 and R2. When setting R1=R2, the adding ratio becomes one. The summed input values of the control signal and the triangle wave signal are presented at input 64 and amplified by the operational amplifier for 1+R4/R3 time, resulting in an output signal V1(t) which is compared with a reference voltage Vref supplied to inverting input 56 of comparator 52 to generate a PWM output voltage Vout(t) at output 58.

Figure 2:
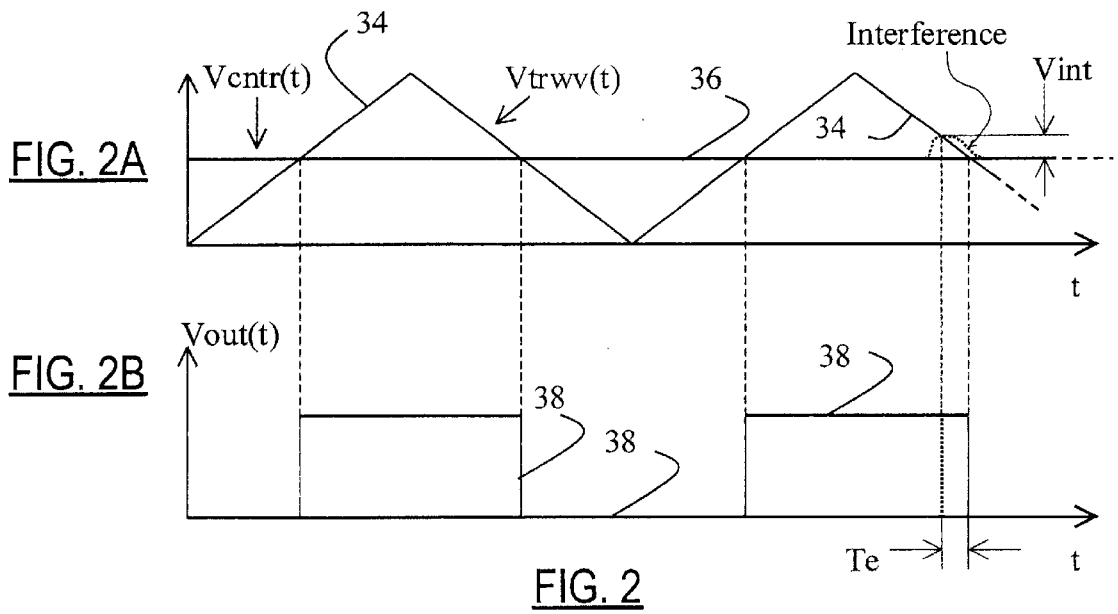
FIG. 2 is a set of time versus voltage graphs showing in FIG. 2A thereof a conventional triangular waveform and generally flat control signal which are fed to the two inputs of the FIG. 1 controller, and showing in FIG. 2B thereof the resulting PWM wave form output, with an illustration of the effect of an interference voltage.

As shown in FIG. 4A, when the same interference voltage signal, Vint, as is shown in FIG. 2A is added to the control signal input represented by 86 in FIG. 4A, it will falsely trigger comparator 52, but the timing error is greatly reduced. The improved timing error (or improved trigger error) Tei caused by this same interference Vint becomes:

$$Tei=Vint/[\text{slew rate of } V1(t)]=Vint/[SR \times (1+R4/R3)]=Te/(1+R4/R3),$$

where Tei is the improved trigger error in time, and SR is the slew rate of the triangle wave voltage Vtrwv(t). It is seen that the improved trigger error Tei is (1+R4/R3) times smaller. In practice, the ratio of R4/R3 can be set to a value between 1 to 999, resulting in a 2 to 1000 times reduction in the trigger error. With current components, a R4/R3 ratio between 1 and 49 is easily achieved even with fairly high-speed circuits. For slower speed circuits, ratios of 50 to 99 or up to a value of a few hundred are readily achieved, and values up to 1000 or more are possible. Thus, the output noise generated by the trigger error is reduced the same number of times. The upper limit is as a practical matter likely to be capped by the speed of comparator 52.

Figure 1:
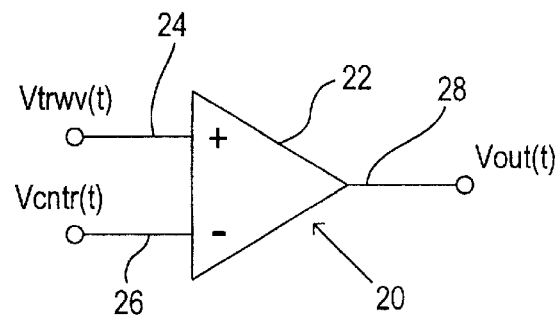
FIG. 1 is prior art pulse width modulation controller.

In the new design shown in FIG. 3, to avoid interference from getting into the control signal Vcntr(t), operational amplifier 62 should be located relatively far away from the PWM generating circuit, mainly comparator 52, and any other sources producing interference. Comparing with the conventional design shown in FIG. 1, comparator 52 generates interference by itself since its output is a series of high slew rate large amplitude pulses. Thus, no matter where comparator 52 is put, the interference will likely get into the control signal Vcntr(t) (located at the input of the comparator) because it is directly from the comparator output.

The advantages of this invention are as follows:

(1) The immunity of the PWM circuit to interference is improved by many times, 2 to 1000 or more, thus, the output has much less noise which is caused by the interference. This is done by amplifying the triangle waveform (or sawtooth waveform, depending on the design) and the control signal many times, then feeding them into the comparator.

(2) Since the circuit is less sensitive to interference, lower grade components (often lower cost), can be used for achieving the same or higher performance in terms of noise, resulting in lower cost products. This is done by using less costly components for the comparator since the immunity of the comparator circuit to interference is increased by the method described above.

(3) The PWM circuit will have a smoother transition when the output duty cycle is approaching zero or 1. This is done by increasing the amplitude of the signals, i.e., the triangle wave with the control signal, then feeding them into the comparator. Thus, the equivalent minimum detectable voltage at the control input is reduced by many times, 2 to 1000 or more. Without using this invention, it is hard to achieve stable outputs, i.e. of low jitter, at the duty cycle of around 1% or 99%. By using this new design, it is easy to achieve stable outputs, even at the duty cycle of around 0.1% or 99.9%.

Figure 5:
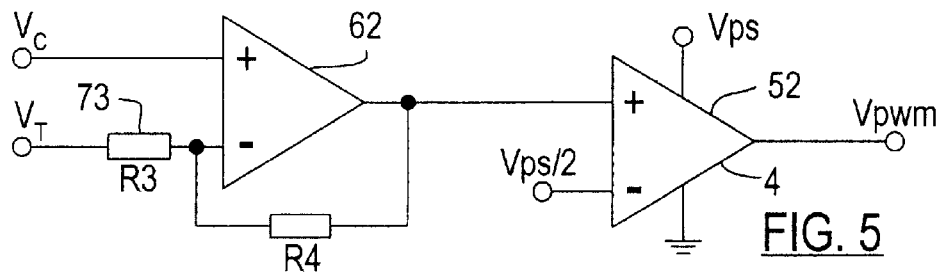
FIG. 5 shows a schematic diagram of a second embodiment of a pulse width modulation circuit/controller of the present invention.

FIG. 5 shows the second embodiment of the present invention, which is like the first embodiment of FIG. 3, except in the following respects. Resistors 71 and 72 have been omitted, and the input signals Vcntr(t) and Vtrwv(t), are now called simply $V_C$ and $V_C$ and $V_T$ are respectively connected to the non-inverting input of comparator 62 and to outer side of resistor 73 as shown.

Figure 6:
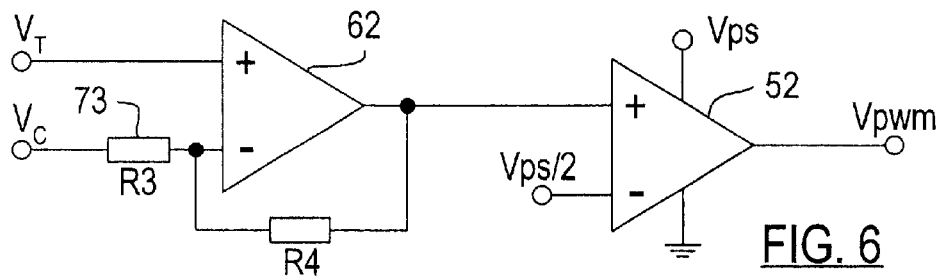
FIG. 6 shows a schematic diagram of a third embodiment of a pulse width modulation circuit/controller of the present invention.

FIG. 6 shows the third embodiment of the present invention, which is like the second embodiment of FIG. 5, except that the input signals have been switched or interchanged, with $V_T$ connected to the non-inverting input of comparator 62 and $V_C$ connected to the outer side of resistor 73 as shown.

Figure 7:
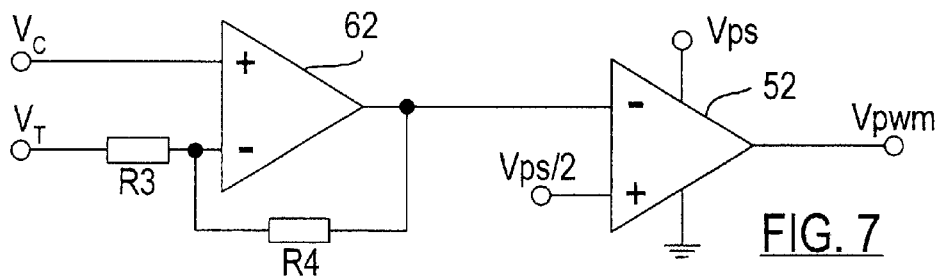
FIG. 7 shows a schematic diagram of a fourth embodiment of a pulse width modulation circuit/controller of the present invention.

FIG. 7 shows the fourth embodiment of the present invention, which is like the second embodiment of FIG. 5, except that the polarity of the input signals of comparator 52 have been switched or interchanged.

Figure 8:
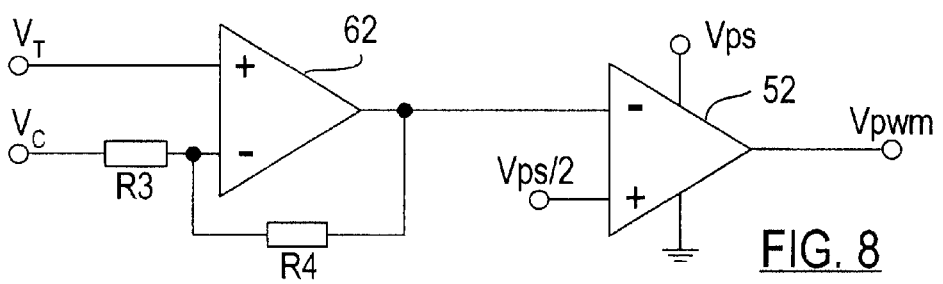
FIG. 8 shows a schematic diagram of a fifth embodiment of a pulse width modulation circuit/controller of the present invention.

FIG. 8 shows the fifth embodiment of the present invention, which is like the third embodiment of FIG. 6, except that the polarity of the input signals of comparator 52 have been switched or interchanged.

Figure 9:
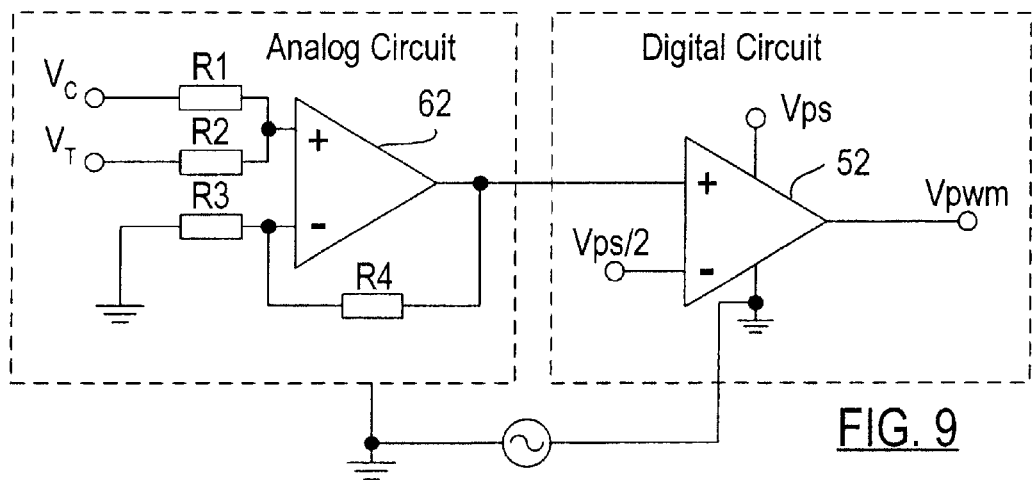
FIG. 9 shows a schematic diagram of a sixth embodiment of a pulse width modulation circuit/controller of the present invention, with a first dotted box placed about the analog circuit section of the controller shown on the left, and a second dotted box placed around the digital circuit section of the controller on the right, and a current meter shown detecting the flow of ground currents between the analog and digital circuit portions, when the PWM output switches state.

FIG. 9 show the sixth embodiment of the present invention, which is like the first embodiment of FIG. 3, except that it shows that the analog circuit section of the controller and the digital circuit section of the controller may be separated by a distance to help minimize the amount of interference that the input control signal $V_C$ will experience. In other words, this interference may be minimized by separating these circuits physically, such as on the layout of a printed circuit board containing both circuit sections. Note that in all of the second through sixth embodiments of FIGS. 5 through 9, the reference voltage signal supplied to the second input of comparator 52 is simply a fraction of the power supply voltage Vps, such as one half of Vps as shown. Thus, this input is not a direct path for electrical noise to travel from the comparator 52 to the input control signal $V_C$. This helps keep the two halves or section of the overall PWM circuit isolated.

Figure 10:
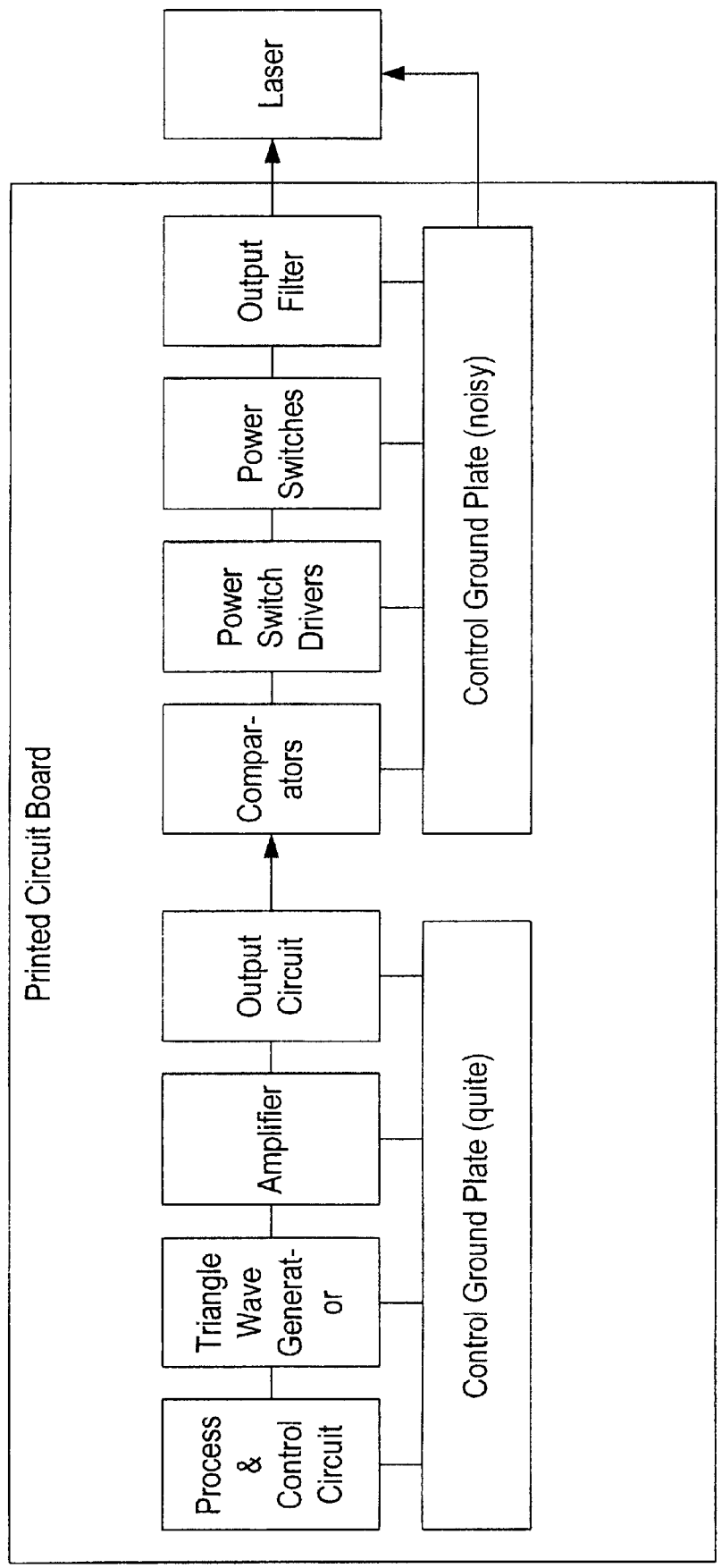
FIG. 10 is a block diagram of a seventh embodiment of the present invention, which represents a useful application for any one of the PWM circuits/controllers of the present invention shown in FIGS. 3, 5, 6, 7, 8 or 9, namely a laser driver circuit, for use, for example, in low to high-speed communications networks employing fiber-optic cables, wherein, on a single printed circuit board having one or two common ground planes, there is mounted the analog section of the PWM circuit/controller of the present invention, represented as being located on the left half of the printed circuit board, and the second or digital circuit of the PWM circuit/controller of the present invention, represented as being located on the right half of the printed circuit board.

FIG. 10 shows a seventh embodiment of the present invention, wherein the PWM circuit/controller of the present invention is incorporated into and made part of an otherwise conventional printed circuit board for driving a diode laser or other laser, which may used for example, in a communications system such as a fiber optic network. This arrangement is conventional, except for its use of the present invention, and except for its careful separation, onto two separate ground planes of the printed circuit board of the various circuitry found in such a laser driver system. In particular, FIG. 10 shows that the lower power control circuitry, shown in four labeled blocks all on the left half of the printed circuit board are on their own control ground plane, which is separated as much as practical from the higher power circuits, which are typically digital or power switching circuits, which are mounted above their own separate power ground plane. The control ground plane is quiet, meaning it features only low level ground currents, so as to minimize ground loop induced electrical noise and/or interference, which will be at much higher levels, due to much larger ground plane currents produced by the circuit blocks as labeled on the right half of the printed circuit board.

The foregoing detailed description shows that the preferred embodiments of the present invention are well suited to fulfill the objects above-stated. In addition, it should be appreciated that designs, circuits and methods of the broader aspects of the present invention can be adapted for a variety of precision PWM driver applications too numerous to mention here. For example, the apparatuses and methods of the present invention can be utilized in very high fidelity audio amplifiers, test and instrumentation equipment, critical timing circuitry, electronic drive circuits subject to spurious noise or interference conditions resulting from electronically noisy environments or dynamically operated power circuits including those noisy environments and/or power circuits found in but not limited to automotive vehicle, industrial control and avionic applications. It should also be recognized that those skilled in the art may make various modifications or additions to the preferred embodiments chosen to illustrate the present invention without departing from the spirit and proper scope of the invention.

For example, the circuits of the present invention may be constructed as or may be included in one or more application specific integrated circuits, or they may be constructed to have parts thereof formed or constructed on one or two different printed circuit boards, or separate components mounted on something other than a printed circuit board. Also, although the comparator and/or amplifiers shown herein are illustrated in block form, they may be implemented using any known or suitable circuit. Further, still different arrangements for the circuits may be utilized as long as they produce the same operational effect and advantages. Also, the noise and interference reducing circuits and methods of the present invention may be combined into and made part of other known PWM circuits used in various applications, including those that have still other noise and/or interference suppression techniques incorporated therein. Accordingly, it is to be understood that the protection sought and to be afforded hereby should be deemed to extend to the subject matter defined by the appended claims, including all fair equivalents thereof.

I claim:

1. A pulse width modulation (PWM) circuit having a PWM output signal featuring accurate timing in the face of an interference signal being imposed upon a control signal input thereto that is representative of the duty cycle of the desired PWM output, the circuit comprising:

a first section having a comparator provided with at least first and second inputs and an output, one of inputs being a noninverting input and the other input being an inverting input, the output producing a PWM signal when proper signals are applied to the first and second inputs of the comparator;

a second section having an operational amplifier provided with first and second inputs and an output, one of the inputs being a noninverting input and the other input being an inverting input, the output producing a substantially on-and-off signal, and the output of the operational amplifier being connected to one of the inputs of the comparators of a switching section, the second section having signal adding means for combining first and second input signals, and providing the summed signal to at least one of the inputs of the operational amplifier, the first input signal being connectable to a triangular wave source, and the second input signal being connectable to a control input signal whose value is generally proportional to the duty cycle of the PWM signal produced by the output of the comparator, and wherein the control signal is summed and amplified in combination with the first input from the triangular wave source by the operational amplifier, whereby the output signal from the output of the operational amplifier is a trapezoidal waveform, and that output signal is delivered to and is in communication with at least one input of the comparator of the first section.

2. A PWM circuit as in claim 1, wherein:

the first section is a digital section for producing a digital PWM output; and the second section is an analog section for receiving analog input signals and generating an analog trapezoidal output signal, the analog trapezoidal output signal being the substantially on-and-off signal.

3. A PWM circuit as in claim 1, wherein:

the signal adding means includes first and second resistors, the first resistor is connected on a first side thereof to one of the inputs of the operational amplifier and a first side of the second resistor, and on a second opposite side thereof is connected to the first input signal, and the second resistor is connected on a second side thereof to the second input signal.

4. A PWM circuit as in claim 1, wherein the operational amplifier of the second section includes a gain of at least about ten.

5. A PWM circuit as in claim 4, wherein the operational amplifier of the second section includes a pair of first and second resistors for setting the gain of the amplifier, with one the resistors being a feedback resistor electrically connected between the output of the amplifier and one of the inputs of the amplifier.

6. A PWM circuit as in claim 2, wherein:

the digital section for producing a digital PWM output is connectable to a laser driver circuit.

7. A method of producing a pulse width modulation output train having fast transitions in a manner that is less susceptible to PWM timing errors on account an interference signal imposed upon a control signal input thereto, which control signal is representative of the duty cycle of the desired PWM output, the method comprising the steps of:

providing a first input signal connected to a triangular wave source;

providing a second input signal connected to the control signal representative of the duty cycle of the desired PWM output;

adding the first and second input signals in real time to produce a summed signal;

continuously providing the summed signal to an operational amplifier having a gain of at least five, in order to produce a substantially on-and-off output signal from the amplifier;

providing the substantially on-and-off output signal to a comparator; and arranging the comparator to produce a PWM output signal that turns on and off in response to receiving the switching states of the substantially on-and-off signal.

8. A method as in claim 7, further comprising the steps of:

providing the comparator with first and second inputs, providing the substantially on-and-off output signal to the first input of the comparator, arranging the operational amplifier to produce a trapezoidal waveform as the form of the substantially on-and-off output signal, and providing to the trapezoidal waveform to the first input of the comparator; and providing a reference signal to the second input of the comparator.

9. A method as in claim 8, wherein the operational amplifier is provided with a gain of at least ten.

10. A method as in claim 8, wherein the operational amplifier is arranged and provided with a closed-loop gain of at least ten.

11. A method as in claim 8, wherein the operational amplifier is arranged and provided with a closed-loop gain of at least about one hundred.

12. A method as in claim 7 of driving a laser driver circuit, the steps further comprising:

providing a laser driver circuit; and connecting the PWM output train of the comparator to the laser driver circuit, whereby the laser is turned on and off in step with and in response to the PWM output train.

* * * * *